(12) United States Patent
Sung et al.

(10) Patent No.: US 10,297,794 B2
(45) Date of Patent: May 21, 2019

(54) ORGANIC LIGHT EMITTING DIODE DISPLAY DEVICE

(71) Applicant: SAMSUNG DISPLAY CO., LTD., Yongin-si, Gyeonggi-Do (KR)

(72) Inventors: Wooyong Sung, Seoul (KR); Doohwan Kim, Yongin-si (KR); Ilsang Lee, Cheonan-si (KR); Minsang Kim, Suwon-si (KR); Seungyong Song, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/470,588

(22) Filed: Mar. 27, 2017

(65) Prior Publication Data

US 2018/0040854 A1 Feb. 8, 2018

(30) Foreign Application Priority Data

Aug. 4, 2016 (KR) .......................... 10-2016-0099437

(51) Int. Cl.
*H01L 51/52* (2006.01)

(52) U.S. Cl.
CPC ...... *H01L 51/5275* (2013.01); *H01L 51/5237* (2013.01); *H01L 51/5256* (2013.01)

(58) Field of Classification Search
CPC ............ H01L 51/5275; H01L 51/5256; H01L 51/5237
USPC ......................................................... 257/40
See application file for complete search history.

(56) References Cited

U.S. PATENT DOCUMENTS

| 9,065,076 B2 | 6/2015 | Lee et al. |
| 9,368,758 B2 | 6/2016 | Lee et al. |
| 2013/0168644 A1* | 7/2013 | Park .................... H01L 51/5234 257/40 |

(Continued)

FOREIGN PATENT DOCUMENTS

| JP | 2005019148 | 1/2005 |
| JP | 2011086527 | 4/2011 |

(Continued)

OTHER PUBLICATIONS

Extended European Search Report for Application Serial No. 17179100.7 dated Apr. 5, 2018.

(Continued)

*Primary Examiner* — Fernando L Toledo
*Assistant Examiner* — Adam S Bowen
(74) *Attorney, Agent, or Firm* — F. Chau & Associates, LLC (57) ABSTRACT

An OLED display device includes a substrate. A first electrode is disposed on the substrate. An organic light emitting layer is disposed on the first electrode. A second electrode is disposed on the organic light emitting layer. A thin film encapsulation layer is disposed on the second electrode. The thin film encapsulation layer includes at least one inorganic layer and at least one organic layer that is disposed alternately with the at least one inorganic layer. The at least one organic layer includes a low refractive index layer overlapping the organic light emitting layer and a high refractive index layer disposed on the low refractive index layer. The high refractive index layer includes a convex surface protruding toward the organic light emitting layer.

26 Claims, 7 Drawing Sheets

(56) References Cited

U.S. PATENT DOCUMENTS

| | | | |
|---|---|---|---|
| 2014/0131669 A1 | 5/2014 | Park | |
| 2014/0141958 A1 | 5/2014 | Lee et al. | |
| 2014/0339509 A1* | 11/2014 | Choi | H01L 51/5275 257/40 |
| 2016/0064695 A1* | 3/2016 | Yoshihara | H01L 51/524 257/40 |
| 2016/0087018 A1 | 3/2016 | Shim et al. | |

FOREIGN PATENT DOCUMENTS

| | | |
|---|---|---|
| KR | 10-2014-0123731 | 10/2014 |
| KR | 10-2014-0135568 | 11/2014 |
| KR | 10-1570968 | 11/2015 |
| KR | 10-1589343 | 1/2016 |
| KR | 10-2016-0032970 | 3/2016 |
| KR | 10-1602418 | 3/2016 |
| KR | 10-1608273 | 3/2016 |
| KR | 10-2016-0046934 | 5/2016 |

OTHER PUBLICATIONS

Shuming Chen, et al., "One-Steop Fabrication of Organic Nanoparticles as Scattering Media for Extracting Substrate Waveguide Light From Organic Light-Emitting Diodes," Journal of Materials Chemistry, 2012, 22, pp. 13386-13390.

* cited by examiner

ORGANIC LIGHT EMITTING DIODE DISPLAY DEVICE

CROSS-REFERENCE TO RELATED APPLICATION

This application claims priority under 35 U.S.C. § 119 to Korean Patent Application No. 10-2016-0099437, filed on Aug. 4, 2016, in the Korean Intellectual Property Office (KIPO), the disclosure of which is incorporated by reference herein in its entirety.

TECHNICAL FIELD

Exemplary embodiments of the present invention relate to a display device, and more particularly, to an organic light emitting diode ("OLED") display device.

DISCUSSION OF RELATED ART

Organic light emitting diode ("OLED") display devices are a self-emission type display devices that display images using OLEDs that emit light. The OLED display devices have characteristics of low power consumption, high luminance, and high response speed.

The OLED display devices have a multilayer structure including an OLED. Each of the layers included in the OLED display device includes different materials, and has different refractive indices. As such, as respective layers have different refractive indices, light may experience reflection or total reflection at interfacial surfaces. A part of the light emitted from the OLED is dissipated due to such reflection or total reflection, and thus the OLED display device may exhibit low light emission efficiency.

SUMMARY

An organic light emitting diode display device includes a substrate. A first electrode is disposed on the substrate. An organic light emitting layer is disposed on the first electrode. A second electrode is disposed on the organic light emitting layer. A thin film encapsulation layer is disposed on the second electrode. The thin film encapsulation layer includes at least one inorganic layer and at least one organic layer that is disposed alternately with the at least one inorganic layer. The at least one organic layer includes a low refractive index layer overlapping the organic light emitting layer and a high refractive index layer disposed on the low refractive index layer, the high refractive index layer having a higher refractive index than a refractive index of the low refractive index layer. The high refractive index layer includes a convex surface protruding toward the organic light emitting layer.

An organic light emitting diode display device includes a substrate, an organic light emitting diode disposed on the substrate, and a thin film encapsulation layer disposed on the organic light emitting diode. The thin film encapsulation layer includes a first inorganic layer disposed on the organic light emitting diode, an organic layer disposed on the first inorganic layer, a second inorganic layer disposed on the organic layer, and a light scattering protrusion disposed on a surface of the first inorganic layer or the second inorganic layer.

An organic light emitting diode display device includes a substrate, an organic light emitting diode disposed (OLED) on the substrate, and a thin film encapsulation layer disposed on the OLED. The thin film encapsulation layer includes an organic layer having a first refractive index and an organic layer having a second refractive index that is greater than the first refractive index and an inorganic layer.

BRIEF DESCRIPTION OF THE DRAWINGS

A more complete appreciation of the present invention will become more apparent by describing in detail exemplary embodiments thereof with reference to the accompanying drawings, wherein.

DETAILED DESCRIPTION

Exemplary embodiments of the present invention will now be described more fully hereinafter with reference to the accompanying drawings. Although the invention can be modified in various manners and may have several embodiments, exemplary embodiments of the present invention are illustrated in the accompanying drawings and will be mainly described in the specification. However, the scope of the invention is not limited to the exemplary embodiments shown and described herein and the invention should be construed as including all the changes, equivalents, and substitutions included in the spirit and scope of the present disclosure.

In the drawings, thicknesses of a plurality of layers and areas may be illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Further when a layer, area, or plate is referred to as being "below" another layer, area, or plate, it may be directly below the other layer, area, or plate, or intervening layers, areas, or plates may be present therebetween. Throughout the specification, when an element is referred to as being "connected" to another element, the element is "directly connected" to the other element, or "electrically connected" to the other element with one or more intervening elements interposed therebetween.

Description of some elements may be omitted from the figures and specification to provide a more clear description, and like reference numerals may refer to like elements throughout the specification and drawings.

Hereinafter, an exemplary embodiment of the present invention will be described with reference to FIGS. 1 and 2.

Figure 1:
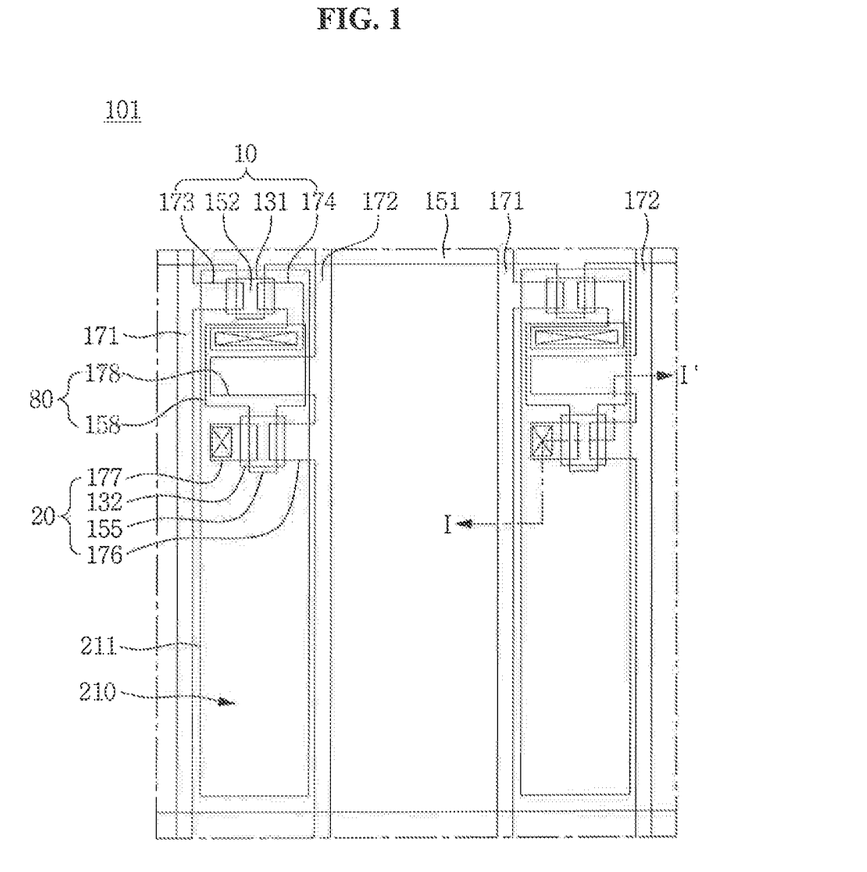
FIG. 1 is a plan view illustrating an organic light emitting diode ("OLED") display device according to an exemplary embodiment of the present invention.
Figure 2:
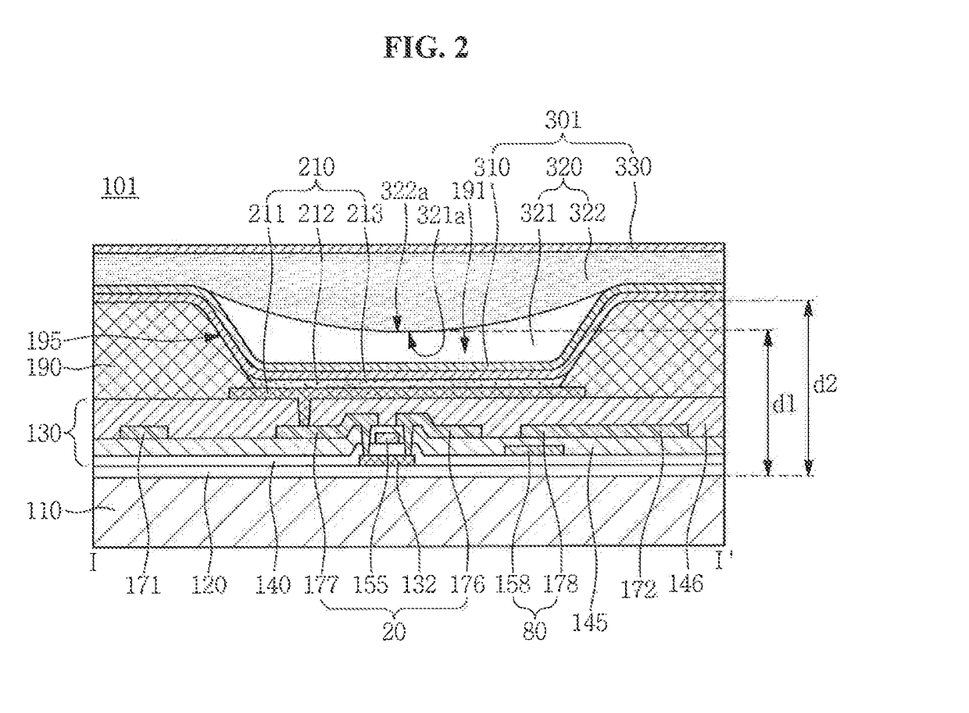
FIG. 2 is a cross-sectional view taken along line I-I' of FIG. 1.

FIG. 1 is a plan view illustrating an organic light emitting diode ("OLED") display device 101 according to an exemplary embodiment of the present invention, and FIG. 2 is a cross-sectional view taken along line I-I' of FIG. 1.

Referring to FIGS. 1 and 2, the OLED display device 101, according to an exemplary embodiment of the present invention, includes a substrate 110, a wiring unit 130, an OLED 210, a pixel defining layer 190, and a thin film encapsulation layer 301.

The substrate 110 may include an insulating material such as glass, quartz, ceramic, plastic, or the like. However, the exemplary embodiment is not limited thereto, and the substrate 110 may include a metal material such as stainless steel.

The buffer layer 120 is disposed on the substrate 110. The buffer layer 120 may include at least one inorganic layer and/or organic layer. The buffer layer 120 may prevent infiltration of undesirable substances, e.g., undesirable elements or moisture, into the wiring unit 130 or into the OLED 210 and the buffer layer 120 may planarize a surface of the substrate 110. However, the buffer layer 120 may alternatively be omitted.

The wiring unit 130 is disposed on the buffer layer 220. The wiring unit 130 may include a switching thin film transistor ("TFT") 10, a driving TFT 20, and a capacitor 80, and the wiring unit 130 may be configured to drive the OLED 210. The OLED 210 emits light based on a driving signal applied from the wiring unit 130 thereby displaying images.

FIGS. 1 and 2 illustrate an active matrix-type organic light emitting diode (AMOLED) display device 101 having a 2Tr-1Cap structure. For example, the 2Tr-1Cap structure may include two TFTs, e.g., the switching TFT 10 and the driving TFT 20, and the capacitor 80, in each pixel. However, the present invention is not limited to this particular arrangement. For example, the OLED display device 101 may include three or more TFTs and two or more capacitors in each pixel, and may further include additional wirings. Herein, the term "pixel" refers to a smallest unit for displaying an image, and it is to be understood that the OLED display device 101 displays an image using a plurality of pixels.

Each pixel includes the switching TFT 10, the driving TFT 20, the capacitor 80, and the OLED 210. In addition, a gate line 151 extending primarily in one direction and a data line 171 and a common power line 172 insulated from and intersecting the gate line 151, are further disposed on the wiring unit 130. Each pixel may be defined by the gate line 151, the data line 171, and the common power line 172 as a boundary, but the present invention is not limited to this particular arrangement. For example, pixels may be defined by the pixel defining layer 190.

The capacitor 80 includes a pair of capacitor plates 158 and 178 with an insulating interlayer 145 interposed therebetween. The insulating interlayer 145 may be a dielectric body. A capacitance of the capacitor 80 is determined by electric charges accumulated in the capacitor 80 and a voltage across the pair of capacitor plates 158 and 178.

The switching TFT 10 includes a switching semiconductor layer 131, a switching gate electrode 152, a switching source electrode 173, and a switching drain electrode 174.

The driving TFT 20 includes a driving semiconductor layer 132, a driving gate electrode 155, a driving source electrode 176, and a driving drain electrode 177. Further, a gate insulating layer 140 may insulate the semiconductor layers 131 and 132 and the gate electrodes 152 and 155.

The switching TFT 10 may function as a switching element which selects a pixel to perform light emission. The switching gate electrode 152 is connected to the gate line 151, and the switching source electrode 173 is connected to the data line 171. The switching drain electrode 174 is spaced apart from the switching source electrode 173 and is connected to one of the capacitor plates, e.g., the capacitor plate 158.

The driving TFT 20 applies a driving power to the first electrode 211. The driving power allows an organic light emitting layer 212 of the OLED 210 in a selected pixel to emit light. The driving gate electrode 155 is connected to the capacitor plate 158 that is connected to the switching drain electrode 174. Each of the driving source electrode 176 and the other of the capacitor plates, e.g., the capacitor plate 178, is connected to the common power line 172. The driving drain electrode 177 is connected to the first electrode 211, which is a pixel electrode of the OLED 210, through a contact hole.

The switching TFT 10 is operated based on a gate voltage applied to the gate line 151 and serves to transmit a data voltage applied to the data line 171 to the driving TFT 20. A voltage equivalent to a difference between a common voltage applied to the driving TFT 20 from the common power line 172 and the data voltage transmitted by (or from) the switching TFT 10 is stored in the capacitor 80. A current corresponding to the voltage stored in the capacitor 80 flows to the OLED 210 through the driving TFT 20 such that the OLED 210 may emit light.

A planarization layer 146 is disposed on the insulating interlayer 145. The planarization layer 146 includes an insulating material and protects the wiring unit 130. The planarization layer 146 and the insulating interlayer 145 may include substantially a same material.

The OLED 210 is disposed on the planarization layer 146. The OLED 210 includes a first electrode 211, the organic light emitting layer 212 on the first electrode 211, and a second electrode 213 on the organic light emitting layer 212. Holes and electrons are respectively supplied from the first electrode 211 and the second electrode 213 into the organic light emitting layer 212 and then combined with each other therein to form an exciton. The OLED 210 may emit light by energy generated when the exciton falls from an excited state to a ground state.

According to an exemplary embodiment of the present invention, the first electrode 211 may serve as an anode to inject holes and the second electrode 213 may serve as a cathode to inject electrons. However, the present invention is not limited to this particular approach, and the first electrode 211 may serve as a cathode while the second electrode 213 may serve as an anode.

According to an exemplary embodiment of the present invention, the first electrode 211 may include a reflective layer, and the second electrode 213 may include a transflective layer. Accordingly, light generated in the organic light emitting layer 212 may pass through the second electrode 213 to be outwardly emitted. For example, the OLED display device 101 according to an exemplary embodiment of the present invention may have a top-emission type structure.

The first electrode 211, for example, may have a structure in which a reflective layer and a transparent conductive layer are stacked. In such an exemplary embodiment, the transparent conductive layer of the first electrode 211 is disposed between the reflective layer and the organic light emitting layer 212.

The reflective layer may include magnesium (Mg), silver (Ag), gold (Au), calcium (Ca), lithium (Li), chromium (Cr), aluminum (Al), and/or copper (Cu).

The transparent conductive layer may include transparent conductive oxide (TCO), for example, indium tin oxide (ITO), indium zinc oxide (IZO), zinc oxide (ZnO), aluminum zinc oxide (AZO), and/or indium oxide ($In_2O_3$). Such a transparent conductive layer may have a relatively high work function, thereby facilitating hole injection through the first electrode 211.

In addition, the first electrode 211 may have a triple-layer structure in which a transparent conductive layer, a reflective layer, and a transparent conductive layer are sequentially stacked. The first electrode 211 might only include a transparent conductive layer. In such an exemplary embodiment, the first electrode 211 becomes a transparent electrode.

The second electrode 213 includes a transflective layer including magnesium (Mg), silver (Ag), gold (Au), calcium (Ca), lithium (Li), chromium (Cr), aluminum (Al), and/or copper (Cu). In general, the transflective layer may have a thickness less than about 200 nm. Light transmittance increases as the thickness of the transflective layer decreases, whereas light transmittance decreases as the thickness of the transflective layer increases.

Although not illustrated, at least one of a hole injection layer HIL and a hole transport layer HTL may be disposed between the first electrode 211 and the organic light emitting layer 212.

In addition, the electron transport layer ETL and/or the electron injection layer EIL may be disposed between the organic light emitting layer 212 and the second electrode 213.

The organic light emitting layer 212, the HIL, the HTL, the ETL, and the EIL may be referred to as an organic layer. The organic layer may include a low molecular weight organic material or a high molecular weight organic material.

The pixel defining layer 190 has an aperture 191. The aperture 191 of the pixel defining layer 190 exposes a portion of the first electrode 211.

For example, the pixel defining layer 190 is disposed on the substrate 110 and overlaps an edge of the first electrode 211. The aperture 191 of the pixel defining layer 190 is defined by a side wall 195. At least a portion of the first electrode 211 is exposed through the pixel defining layer 190 by the aperture 191.

The organic light emitting layer 212 and the second electrode 213 are sequentially stacked on a portion of the first electrode 211 exposed by the aperture 191 of the pixel defining layer 190. The second electrode 213 may also be disposed on the pixel defining layer 190 as well as on the organic light emitting layer 212. In addition, the HIL, the HTL, the ETL, and the EIL may be disposed between the pixel defining layer 190 and the second electrode 213. The OLED 210 emits light from the organic light emitting layer 212 in the aperture 191 of the pixel defining layer 190. As such, the pixel defining layer 190 may define a light emission area.

The thin film encapsulation layer 301 is disposed on the second electrode 213 so as to protect the OLED 210. The thin film encapsulation layer 301 prevents infiltration of external contaminants, such as moisture or oxygen, into the OLED 210.

The thin film encapsulation layer 301 includes at least one inorganic layer 310 and 330 and at least one organic layer 320. The inorganic layer(s) 310 and 330 and the organic layer 320 may be alternately disposed.

It is illustrated in FIG. 2 that the thin film encapsulation layer 301 includes two inorganic layers 310 and 330 and one organic layer 320, however, exemplary embodiments of the present invention are not limited to this particular arrangement.

The inorganic layers 310 and 330 may include one or more inorganic material such as $Al_2O_3$, $TiO_2$, ZrO, $SiO_2$, AlON, AlN, SiON, $Si_3N_4$, ZnO, and/or $Ta_2O_5$. The inorganic layers 310 and 330 may be formed through methods such as a chemical vapor deposition (CVD) method or an atomic layer deposition (ALD) method. However, the present invention is not limited thereto, and the inorganic layers 310 and 330 may be formed using various methods known to those skilled in the art.

The organic layer 320 may include a polymer-based material. Examples of the polymer-based material may include, for example, an acrylic resin, an epoxy resin, polyimide, and polyethylene. The organic layer 320 may be formed through a thermal deposition process. The thermal deposition process for forming the organic layer 320 may be performed at a temperature range that will not damage the OLED 210. However, the present invention is not limited to forming the organic layer 320 by thermal deposition processes, and the organic layer 320 may be formed using various methods known to those skilled in the pertinent art.

The inorganic layers 310 and 330, which have a high density of thin film, may prevent or efficiently reduce infiltration of external contaminants such as moisture or oxygen. Infiltration of moisture and oxygen into the OLED 210 may therefore be largely prevented by the inorganic layers 310 and 330.

Moisture and oxygen that have passed through the inorganic layers 310 and 330 may further be blocked by the organic layer 320. The organic layer 320 may have relatively low moisture-infiltration preventing efficacy, as compared to the inorganic layers 310 and 330. However, the organic layer 320 may also serve as a buffer layer to reduce stress among the inorganic layers 310 and 330 and the organic layer 320, in addition to performing the moisture-infiltration preventing function. Further, since the organic layer 320 has planarization characteristics, an uppermost surface of the thin film encapsulation layer 301 may be planarized by the organic layer 320.

The thin film encapsulation layer 301 may have a thickness of about 50 μm or less, and when desired, may have a thickness of about 10 μm or less. Accordingly, the OLED display device 101 may be relatively thin.

A sealing substrate may be disposed on the thin film encapsulation layer 301 so as to protect the OLED 210. The sealing substrate opposes the substrate 110 and is coupled to the substrate 110 so as to protect the OLED 210. The sealing substrate may use a transparent insulating substrate such as glass, quartz, ceramic, plastic, or the like. The sealing substrate may be omitted. In a case where the sealing substrate is omitted, the OLED display device 101 may be rendered more flexible.

Although not illustrated, the OLED display device 101 may further include a capping layer disposed between the OLED 210 and the thin film encapsulation layer 301. The capping layer has light transmittance and serves to protect the OLED 210. The capping layer 230 may also serve to allow light emitted from the organic light emitting layer 212 to be outwardly emitted in an efficient manner.

Hereinafter, a structure of the organic layer 320 will be described in detail.

The organic layer 320 includes a low refractive index layer 321 overlapping the organic light emitting layer 212. A high refractive index layer 322 is disposed on the low refractive index layer 321. The high refractive index layer 322 has a higher refractive index than that of the low refractive index layer 321. In addition, the high refractive index layer 322 has a convex surface 322a protruding toward the organic light emitting layer 212.

Referring to FIG. 2, the convex surface 322a of the high refractive index layer 322 is disposed in the aperture 191 of the pixel defining layer 190. In addition, the high refractive index layer 322 is also disposed above the pixel defining layer 190. For example, the high refractive index layer 322 may cover an entire surface above the substrate 110.

The low refractive index layer 321 is disposed in the aperture 191 of the pixel defining layer 190 and has a concave surface 321a corresponding to the convex surface 322a of the high refractive index layer 322. Referring to FIG. 2, the high refractive index layer 322 and the low refractive index layer 321 contact each other. A surface of the low refractive index layer 321 contacting the convex surface 322a of the high refractive index layer 322 corresponds to the concave surface 321a.

However, the present invention is not limited to the configuration illustrated in FIG. 2, and the low refractive index layer 321 may extend above the pixel defining layer 190. In such an exemplary embodiment of the present invention, the concave surface 321a is positioned in the aperture 191.

Referring to FIG. 2, at least a portion of the convex surface 322a is positioned downwardly from an upper surface of the pixel defining layer 190. In addition, with respect to a surface of the substrate 110, at least a portion of the concave surface 321a may be thinner than the side wall 195 of the pixel defining layer 190. Herein, a height "d2" of the side wall 195 is substantially the same as a height of the upper surface of the pixel defining layer 190. In detail, with respect to the surface of the substrate 110, a low point of the concave surface 321a has a height "d1" and the side wall 195 has the height "d2". In such an exemplary embodiment, d2>d1 is satisfied.

The inorganic layers 310 and 330 include a first inorganic layer 310 disposed between the second electrode 213 and the low refractive index layer 321. A second inorganic layer 330 is disposed on the high refractive index layer 322. Referring to FIG. 2, the first inorganic layer 310 is also disposed between the pixel defining layer 190 and the high refractive index layer 322.

The first inorganic layer 310 and the second inorganic layer 330 may include substantially a same material or may include different materials. For example, the first inorganic layer 310 may be formed by co-deposition of silicon oxynitride (SiON) and silicon oxide (SiOx) and the second inorganic layer 330 may include silicon nitride (SiNx). However, the kinds of the first inorganic layer 310 and the second inorganic layer 330 are not limited thereto.

Referring to FIG. 2, the first inorganic layer 310 covers the organic light emitting layer 212, the side wall 195, and the pixel defining layer 190. The low refractive index layer 321 contacts the first inorganic layer 310 above the organic light emitting layer 212 and above the side wall 195 of the pixel defining layer 190.

The first inorganic layer 310 has a higher surface tension than that of the low refractive index layer 321. Accordingly, when a material forming the low refractive index layer 321 does not completely fill the aperture 191, a portion of the material forming the low refractive index layer 321 moves, due to the surface tension, up the side wall 195 along the first inorganic layer 310. Accordingly, the concave surface 321a is defined by the low refractive index layer 321. The low refractive index layer 321 may be formed by, for example, an inkjet method.

The low refractive index layer 321 may include a light transmissive organic material having low refractive index. The low refractive index layer 321 may include an acrylic resin, a polyimide resin, a polyamide resin, and/or $Alq_3$[Tris (8-hydroxyquinolinato)aluminum].

The low refractive index layer 321 has a refractive index ranging from about 1.4 to about 1.6. For example, the low refractive index layer 321 has a refractive index ranging from about 1.48 to about 1.55.

The high refractive index layer 322 includes a light transmissive organic material having high refractive index. The high refractive index layer 322 may include poly(3,4-ethylenedioxythiophene) (PEDOT), 4,4'-bis[N-(3-methylphenyl)-N-phenylamino]biphenyl (TPD), 4,4',4"-tris[(3-methylphenyl)phenylamino]triphenylamine (m-MTDATA), 1,3,5-tris [N,N-bis(2-methylphenyl)-amino]benzene (o-MTDAB), 1,3,5-tris[N,N-bis(3-methylphenyl)-amino] benzene (m-MTDAB), 1,3,5-tris [N,N-bis (4-methylphenyl) amino]benzene (p-MTDAB), 4,4'-bis[N,N-bis(3-methylphenyl)-amino]diphenylmethane (BPPM), 4,4-dicarbazolyl-1,1'-biphenyl (CBP), 4,4',4"-tris(N-carbazole) triphenylamine (TCTA), 2,2',2"-(1,3,5-benzenetolyl)tris-[1-phenyl-1H-benzoimidazol] (TPBI), and/or 3-(4-biphenyl)-4-phenyl-5-t-butylphenyl-1,2,4-triazole (TAZ).

The high refractive index layer 322 has a refractive index ranging from about 1.61 to about 1.8.

The low refractive index layer 321 and the high refractive index layer 322 have a refractive index difference ranging from about 0.1 to about 0.3. Due to such a refractive index difference, the high refractive index layer 322 having the convex surface 322a may function as a convex lens. Accordingly, the high refractive index layer 322 may serve to collimate light like a convex lens.

Figure 3:
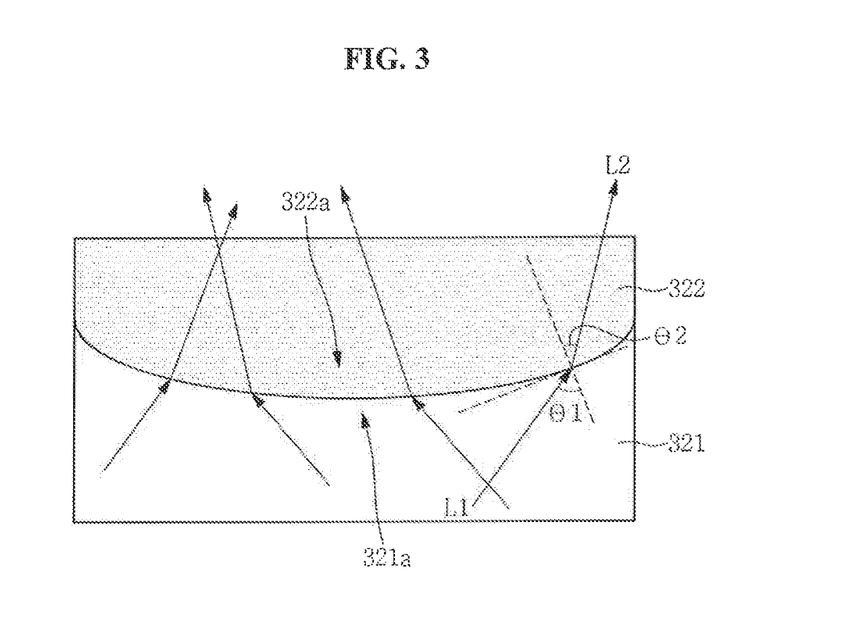
FIG. 3 is a cross-sectional view illustrating a light path in a low refractive index layer and a high refractive index layer.

FIG. 3 is a cross-sectional view illustrating a light path in the low refractive index layer 321 and the high refractive index layer 322.

A light L1 emitted from the organic light emitting layer 212 and incident to the low refractive index layer 321 is refracted at an interfacial surface between the low refractive index layer 321 and the high refractive index layer 322. Referring to FIG. 3, the light L1 is incident at an angle (incident angle) of θ1 to the interfacial surface between the low refractive index layer 321 and the high refractive index layer 322, and is then refracted at an angle (refraction angle) of θ2 as a light L2. In such an exemplary embodiment, a refractive index "n2" of the high refractive index layer 322 is higher than a refractive index "n1" of the low refractive index layer 321 (n2>n1), such that "θ2<θ1" is satisfied. Accordingly, the light L2 incident to the high refractive index layer 322 has a state of being collimated more toward the front side, as compared to the light L1 incident to the low refractive index layer 321.

As such, as the high refractive index layer 322 having the convex surface 322a serves to collimate light, the front visibility of the OLED display device 101 is increased.

Subsequently, an exemplary embodiment of the present invention will be described with reference to FIG. 4.

Figure 4:
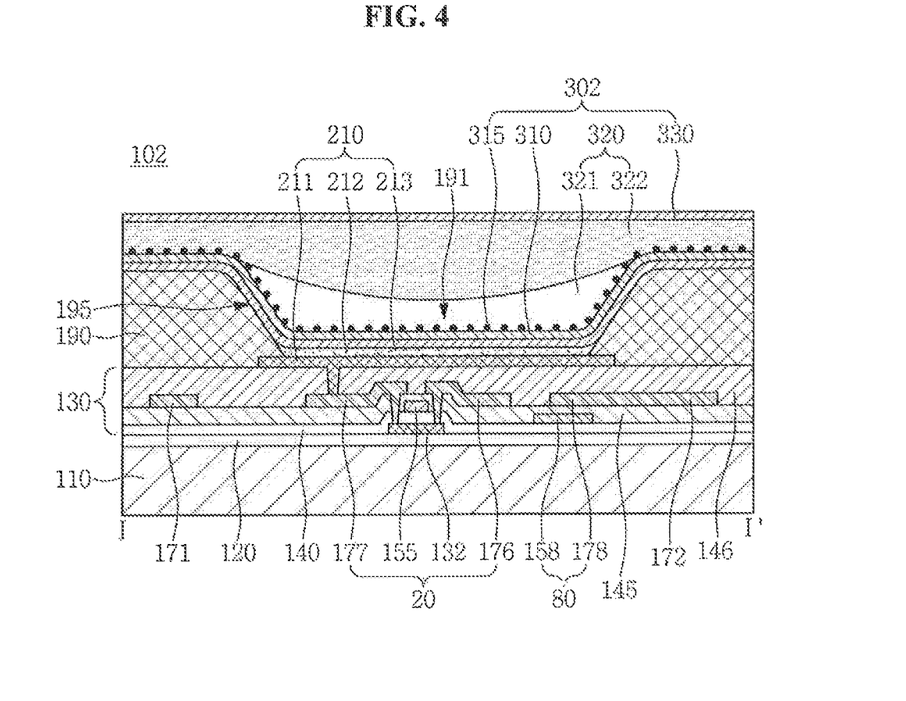
FIG. 4 is a cross-sectional view illustrating an OLED display device according to an exemplary embodiment of the present invention.

FIG. 4 is a cross-sectional view illustrating an OLED display device 102 according to an exemplary embodiment of the present invention.

The OLED display device 102 may include an OLED 210 and a thin film encapsulation layer 302. The thin film encapsulation layer 302 includes a light scattering protrusion 315 disposed on at least one inorganic layer 310 and 330. The light scattering protrusion 315 may have substantially a same composition as that of the inorganic layers 310 and 330 or may have a different composition from that of the inorganic layers 310 and 330.

According to an exemplary embodiment of the present invention, the thin film encapsulation layer 302 includes the light scattering protrusion 315 disposed on a surface of the first inorganic layer 310. Referring to FIG. 4, the light scattering protrusion 315 is disposed on the surface of the first inorganic layer 310 and contacts a low refractive index layer 321. In addition, the light scattering protrusion 315 may contact a high refractive index layer 322 disposed above the pixel defining layer 190.

According to an exemplary embodiment of the present invention, the light scattering protrusion 315 has substantially a same composition as that of the first inorganic layer 310. In addition, the light scattering protrusion 315 may be part of a singular structure with the first inorganic layer 310.

According to an exemplary embodiment of the present invention, the light scattering protrusion 315 may be manufactured through a process which is continuously performed subsequent to a process of forming the first inorganic layer 310. For example, after the first inorganic layer 310 is formed by deposition, a core having a fine particle form is formed on the first inorganic layer 310, and then only a deposition source is provided without plasma to grow the core such that the light scattering protrusion 315 may be formed. In such an exemplary embodiment, the first inorganic layer 310 and the light scattering protrusion 315 may have substantially a same composition.

The light scattering protrusion 315 forms an unevenness on the surface of the first inorganic layer 310. For example, the light scattering protrusion 315 formed as part of a singular/unitary structure with the first inorganic layer 310 may provide a non-uniform surface to the first inorganic layer 310.

However, the present invention is not limited to this particular arrangement, and the light scattering protrusion 315 may include a different material from a material included in the first inorganic layer 310 to have a different composition from a composition of the first inorganic layer 310. In addition, after the first inorganic layer 310 is formed, the light scattering protrusion 315 may be formed through a separate process.

The size of the light scattering protrusion 315 may be defined by a height from a surface 310a of the first inorganic layer 310 or a diameter of the light scattering protrusion 315. Hereinbelow, the diameter of the light scattering protrusion 315 is to be defined as a size of the light scattering protrusion 315.

The light scattering protrusion 315 having a size ranging from about 0.1 µm to about 5 µm may scatter light. The light scattering protrusion 315 may have an average size ranging from about 0.5 µm to about 2.0 µm. For example, the light scattering protrusion 315 may have an average size ranging from about 1.0 µm to about 1.5 µm.

The light scattering protrusion 315 scatters light emitted from the organic light emitting layer 212, thus increasing side visibility of the OLED display device 102. In addition, the light scattering protrusion 315 may serve to direct light trapped by total reflection in a layer to be emitted outwards. Accordingly, the light scattering protrusion 315 may increase light emission efficiency of the OLED display device 102.

According to an exemplary embodiment of the present invention, the OLED display device 102 has a multilayer stack structure, and thus a part of light emitted from the organic light emitting layer 212 may be trapped by total reflection in a layer while being emitted outwards, thereby being dissipated.

Figure 5:
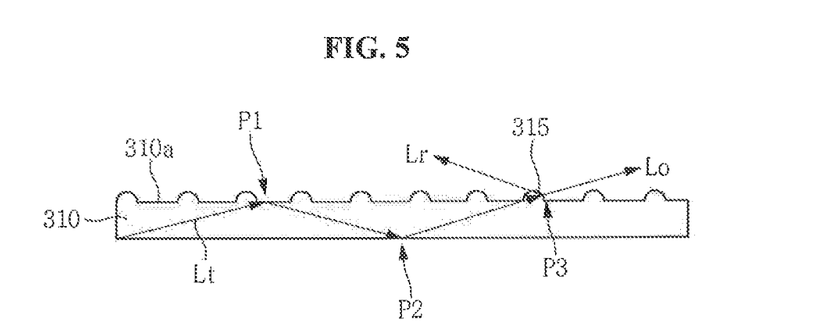
FIG. 5 is a cross-sectional view illustrating a light path in an inorganic layer.

FIG. 5 is a cross-sectional view illustrating a light path in an inorganic layer, and illustrates a path of light Lt experiencing total reflection. Referring to FIG. 5, the light scattering protrusion 315 is formed on the surface 310a of the first inorganic layer 310. The light scattering protrusion 315 may be formed as a singular structure with the first inorganic layer 310.

A light Lt trapped by total reflection in the first inorganic layer 310 repeats total reflection in the first inorganic layer 310. For example, the light Lt is totally reflected at a point P1 and a point P2 of the first inorganic layer 310.

However, a path of the light is changed at a surface of the light scattering protrusion 315. For example, an incident angle of the light Lt propagating to the surface of the light scattering protrusion 315 is different from an incident angle at the point P1 or the point P2. Referring to FIG. 5, the incident angle of the light Lt propagating to the surface of the light scattering protrusion 315 is less than a total reflection angle. Accordingly, the light Lt may be refracted from the surface of the light scattering protrusion 315 to be emitted outwards as a light Lo. In addition, a part of the light Lt propagating to the surface of the light scattering protrusion 315 may be reflected to be emitted outwards as a light Lr. As such, the light trapped by total reflection may be emitted outwards by the light scattering protrusion 315, and thus light emission efficiency of the OLED display device 102 may be increased.

In an exemplary embodiment of the present invention, in a process in which the light emitted from the organic light emitting layer 212 is transmitted through the multilayer stack structure, a light path difference may occur. In a case where the light path difference occurs, although light having substantially a same wavelength is emitted from the organic light emitting layer 212, the light may be recognized as different colors based on a viewing angle of users. Accordingly, a white angular dependency (WAD) phenomenon may occur.

The WAD may refer to color shift observed from a side viewing angle, for example, a phenomenon in which a color of light is differently perceived between a case where a display surface is viewed from the front and a case where the display surface is viewed from the side. In a case where the WAD occurs, when a display device emitting white light is viewed from the front, white light is perceived, but when the display device is viewed from the side, blue or yellow components may be partially perceived due to a wavelength shift.

The light scattering protrusion 315 changes a light path and diffuses light. Accordingly, light that propagates along different paths, respectively, is diffused and mixed, while propagating through the light scattering protrusion 315, such that substantially a same color may be perceived by a user although a viewing angle is changed. As such, the WAD effect of the OLED display device 102 may be reduced by the light scattering protrusion 315.

According to an exemplary embodiment of the present invention, the OLED display device 102 including the light scattering protrusion 315 has a haze of about 30% or more.

The haze value is calculated by a ratio of a diffused light to an entire transmitted light transmitted through a sample. For example, a haze of a predetermined sample may be calculated by the following formula.

Haze (%)=[(diffused light)/(entire transmitted light)]×100

The OLED display device 102 according to an exemplary embodiment of the present invention may have a haze ranging from about 30% to about 70%. As the haze increases, the WAD effect may be further reduced.

The haze may vary based on size, kind, a refractive index, and density distribution of the light scattering protrusion 315.

According to an exemplary embodiment of the present invention, although the light scattering protrusion 315 scatters the light emitted from the organic light emitting layer 212 such that a haze increases, the organic layer 320 having a lens structure increases light efficiency and visibility of the OLED display device 102. Accordingly, the WAD effect of the OLED display device 102 may be reduced without experiencing light efficiency deterioration.

Hereinafter, an exemplary embodiment of the present invention will be described with reference to FIG. 6.

Figure 6:
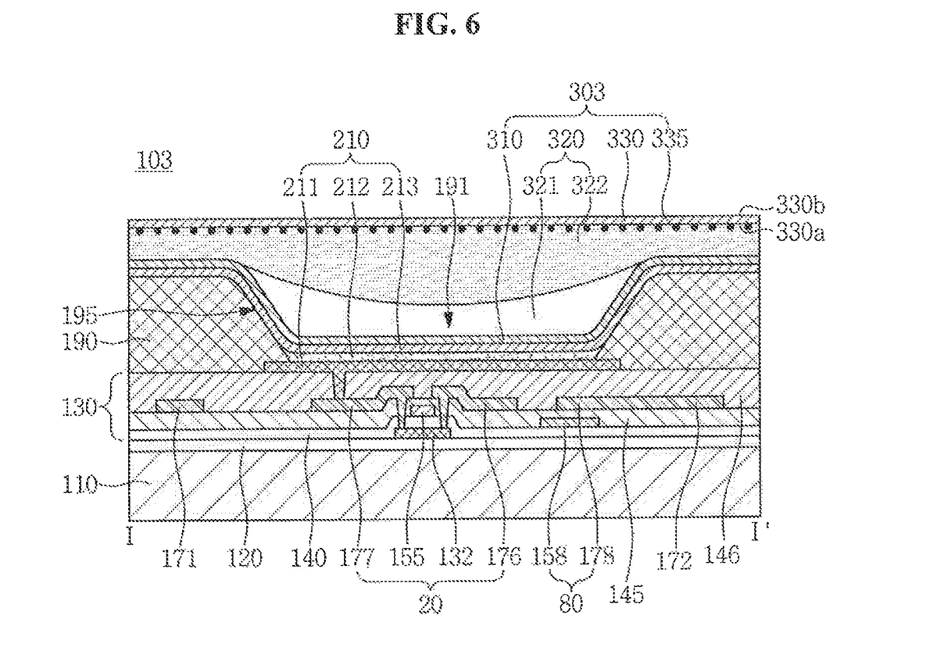
FIG. 6 is a cross-sectional view illustrating an OLED display device according to an exemplary embodiment of the present invention.

FIG. 6 is a cross-sectional view illustrating an OLED display device 103 according to an exemplary embodiment of the present invention.

The OLED display device 103 according to an exemplary embodiment of the present invention includes a substrate 110, an OLED 210 disposed on the substrate 110, and a thin film encapsulation layer 303 disposed on the OLED 210. The thin film encapsulation layer 303 includes a first inorganic layer 310 disposed on the OLED 210, an organic layer 320 disposed on the first inorganic layer 310, and a second inorganic layer 330 disposed on the organic layer 320. A light scattering protrusion 335 is disposed on a surface of the second inorganic layer 330. Referring to FIG. 6, the light scattering protrusion 335 is disposed on a surface of the second inorganic layer 330 that opposes a high refractive index layer 322 of the organic layer 320.

Referring to FIG. 6, the second inorganic layer 330 has a first surface 330a contacting the organic layer 320 and a second surface 330b opposite to the organic layer 320. The light scattering protrusion 335 is disposed on the first surface 330a of the second inorganic layer 330. The light scattering protrusion 335 contacts the high refractive index layer 322.

The light scattering protrusion 335 may be formed through a process that is continuously performed subsequent to a process of forming the second inorganic layer 330. For example, a core having a fine particle form is formed on the organic layer 320 using silicon nitride (SiNx), and then silicon nitride (SiN) is provided to the core in a state absent plasma to grow the core such that the light scattering protrusion 335 may be formed. Subsequently, the second inorganic layer 330 may be formed on the light scattering protrusion 335, using silicon nitride (SiN), through a typical layer-forming method. In such an exemplary embodiment, the light scattering protrusion 335 and the second inorganic layer 330 may be formed as part of a singular structure.

However, the present invention is not limited thereto, and the light scattering protrusion 335 may have a different composition from that of the second inorganic layer 330, and may be formed through a separate process aside from a process of forming the second inorganic layer 330.

Hereinafter, an exemplary embodiment of the present invention will be described with reference to FIG. 7.

Figure 7:
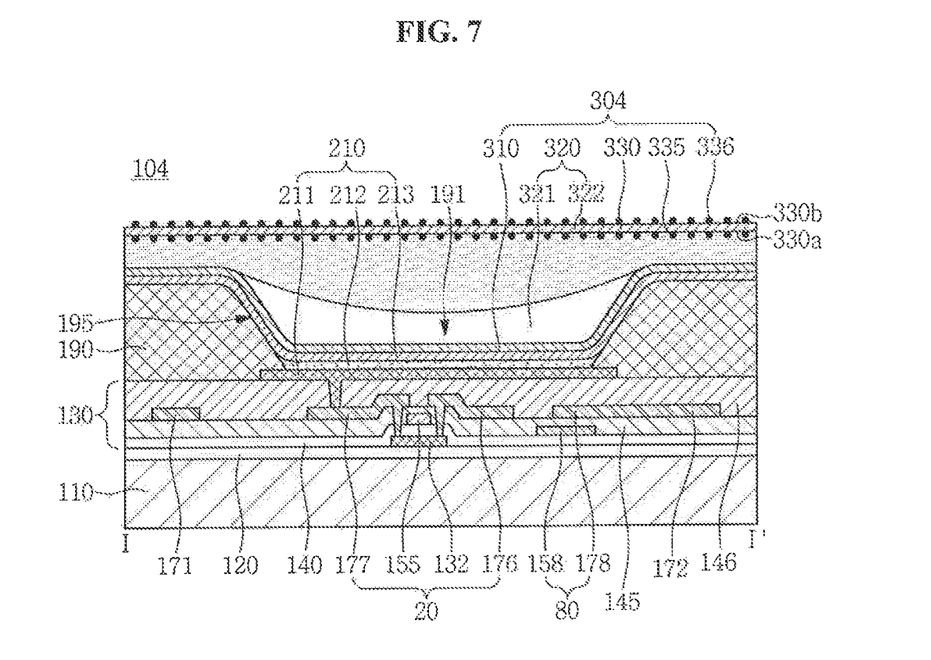
FIG. 7 is a cross-sectional view illustrating an OLED display device according to an exemplary embodiment of the present invention.

FIG. 7 is a cross-sectional view illustrating an OLED display device 104 according to an exemplary embodiment of the present invention.

A thin film encapsulation layer 304 including light scattering protrusions 335 and 336 is disposed on opposite surfaces 330a and 330b of a second inorganic layer 330. A light scattering protrusion 335 on a first surface 330a of the second inorganic layer 330 may be referred to as a first light scattering protrusion, and a light scattering protrusion 336 on a second surface 330b of the second inorganic layer 330 may be referred to as a second light scattering protrusion.

The light scattering protrusions 335 and 336 may have substantially a same composition as that of the second inorganic layer 330, and the light scattering protrusions 335 and 336 and the second inorganic layer 330 may be formed as part of a singular structure.

However, the present invention is not limited to this particular configuration, and the light scattering protrusions 335 and 336 may have a different composition from that of the second inorganic layer 330, and the light scattering protrusions 335 and 336 may be formed through a separate process aside from a process of forming the second inorganic layer 330.

Hereinafter, an exemplary embodiment of the present invention will be described with reference to FIG. 8.

Figure 8:
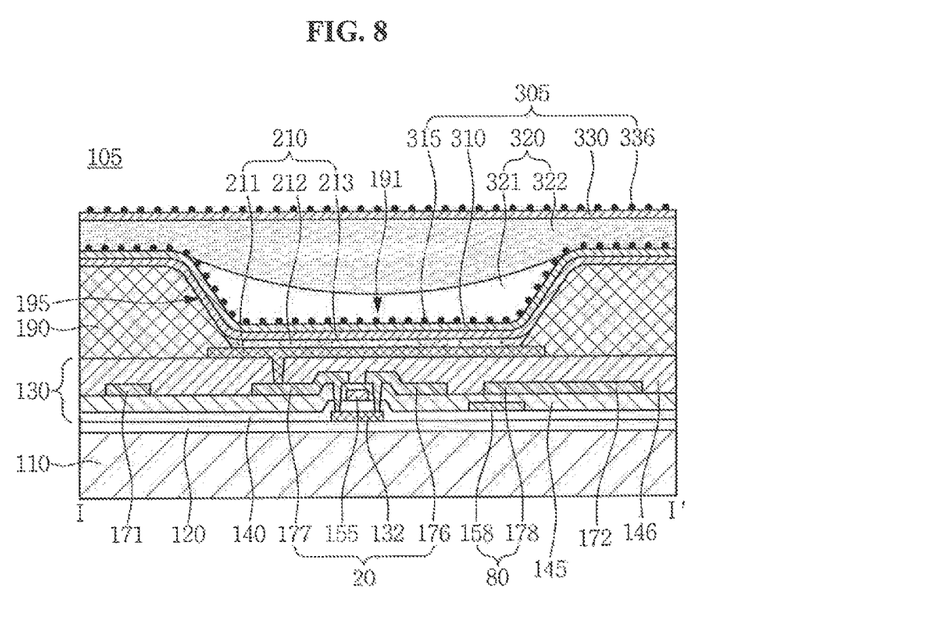
FIG. 8 is a cross-sectional view illustrating an OLED display device according to an exemplary embodiment of the present invention.

FIG. 8 is a cross-sectional view illustrating an OLED display device 105 according to an exemplary embodiment of the present invention.

The OLED display device 105 according to an exemplary embodiment of the present invention includes a substrate 110, an OLED 210 disposed on the substrate 110, and a thin film encapsulation layer 305 disposed on the OLED 210. The thin film encapsulation layer 305 includes a first inorganic layer 310 on the OLED 210, an organic layer 320 disposed on the first inorganic layer 310, a second inorganic layer 330 disposed on the organic layer 320, and a light scattering protrusion 315 disposed on the first inorganic layer 310, and a light scattering protrusion 336 disposed on the second inorganic layer 330.

Referring to FIG. 8, the light scattering protrusion 315 is disposed on a surface of the first inorganic layer 310 that opposes the organic layer 320, and the light scattering protrusion 336 is disposed on a surface of the second inorganic layer 330 opposite to the organic layer 320.

The light scattering protrusion 315 disposed on the first inorganic layer 310 may have substantially a same composition as that of the first inorganic layer 310. The light scattering protrusion 336 disposed on the second inorganic layer 330 may have substantially a same composition as that of the second inorganic layer 330.

However, the invention is not limited to this particular configuration. The light scattering protrusion 315 disposed on the first inorganic layer 310 may have a different composition from that of the first inorganic layer 310, and the light scattering protrusion 336 disposed on the second inorganic layer 330 may have a different composition from that of the second inorganic layer 330.

Hereinafter, an exemplary embodiment of the present invention will be described with reference to FIG. 9.

Figure 9:
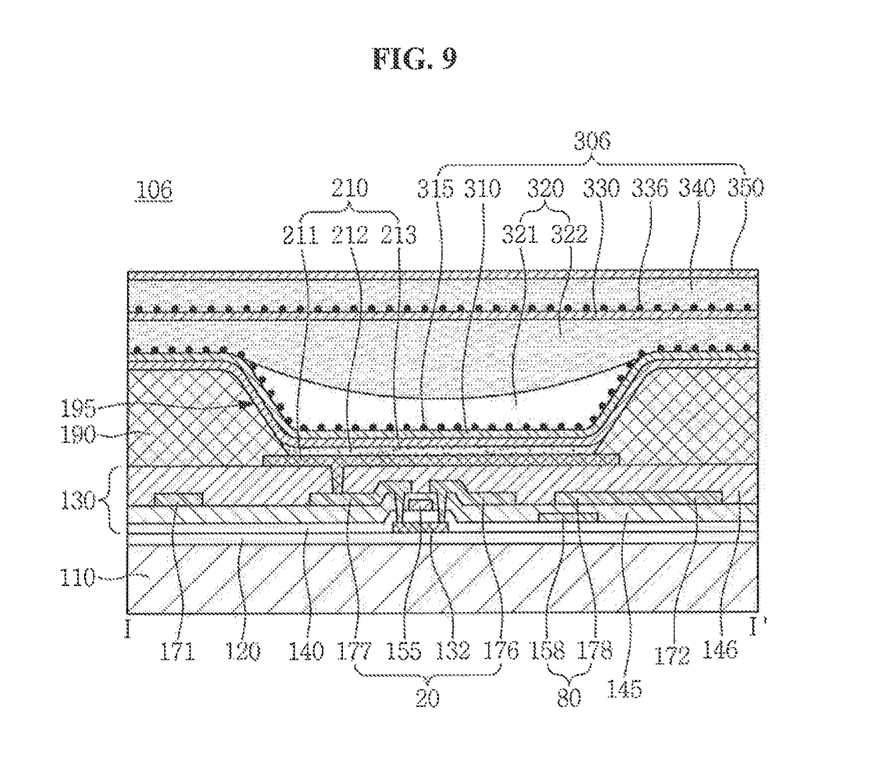
FIG. 9 is a cross-sectional view illustrating an OLED display device according to an exemplary embodiment of the present invention.

FIG. 9 is a cross-sectional view illustrating an OLED display device 106 according to an exemplary embodiment of the present invention.

A thin film encapsulation layer 306 includes three inorganic layers 310, 330, and 350 and two organic layers 320 and 340 that are alternately disposed. For example, an organic layer 320 is adjacent to a first inorganic layer 310. The organic layer that is closest to an OLED 210 may be referred to as a first organic layer. An organic layer 340 that is between a second inorganic layer 330 and a third inorganic layer 350 may be referred to as a second organic layer.

The thin film encapsulation layer 306 may include a light scattering protrusion 315 on the first inorganic layer 310 and a light scattering protrusion 336 on the second inorganic layer 330. Referring to FIG. 9, the light scattering protrusion 336 on a surface of the second inorganic layer 330 contacts the second organic layer 340.

Hereinafter, an exemplary embodiment of the present invention will be described with reference to FIG. 10.

Figure 10:
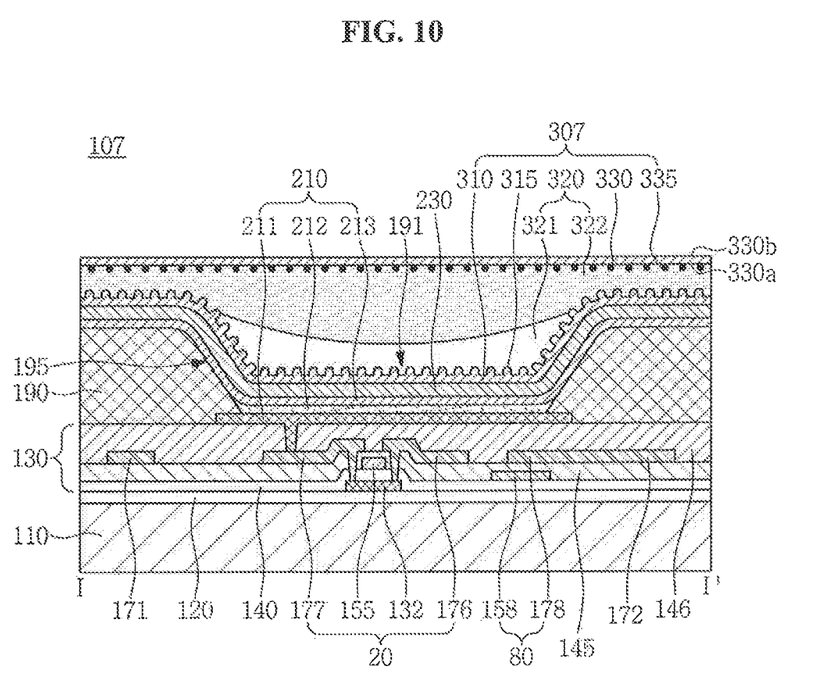
FIG. 10 is a cross-sectional view illustrating an OLED display device according to an exemplary embodiment of the present invention.

FIG. 10 is a cross-sectional view illustrating an OLED display device 107 according to an exemplary embodiment of the present invention.

A thin film encapsulation layer 307 includes a light scattering protrusion 315 disposed on a surface of a first inorganic layer 310 and a light scattering protrusion 335 disposed on a first surface 330a of a second inorganic layer 330.

The light scattering protrusion 315 disposed on the surface of the first inorganic layer 310 contacts a low refractive index layer 321. In addition, the light scattering protrusion 315 may contact a high refractive index layer 322, above a pixel defining layer 190.

The light scattering protrusion 335 disposed on the first surface 330a of the second inorganic layer 330 contacts the high refractive index layer 322 of an organic layer 320.

In addition, the OLED display device 107 may include a capping layer 230 disposed between an OLED 210 and the first inorganic layer 310.

The capping layer 230 is capable to transmitting light and serves to protect the OLED 210. The capping layer 230 may also serve to allow light emitted from an organic light emitting layer 212 to be outwardly emitted efficiently.

The capping layer 230 may include an inorganic material and/or an organic material, each capable of transmitting light. For example, the capping layer 230 may include an inorganic layer or an organic layer, or may include an organic layer including inorganic particles.

In addition, the capping layer 230 may include two or more materials having different refractive indices. For example, the capping layer 230 may include combination of a high refractive index material and a low refractive index material. The high refractive index material and the low refractive index material may be an organic material or an inorganic material.

The capping layer 230 may have a thickness ranging from about 80 nm to about 300 nm, or may have a thickness of about 300 nm or more, e.g., ranging from about 300 nm to about 900 nm or more. As the capping layer 230 may be relatively thick, the OLED 210 may be well protected. However, when the capping layer 230 is thick, it might be difficult to keep the OLED display device relatively thin.

The capping layer 230 may be manufactured through methods known in the pertinent art. For example, the capping layer 230 may be manufactured through deposition. In a deposition process for manufacturing the capping layer 230, a high refractive index material and a low refractive index material may be used together. As an amount of deposition or a deposition ratio of the high refractive index material and the low refractive index material is adjusted, a refractive index of the capping layer 230 may be adjusted.

As set forth above, according to one or more exemplary embodiments of the present invention, an OLED display device may be made to have excellent light emission efficiency.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. An organic light emitting diode display device comprising:
    a substrate;
    a first electrode disposed on the substrate;
    an organic light emitting layer disposed on the first electrode;
    a second electrode disposed on the organic light emitting layer; and
    a thin film encapsulation layer disposed on the second electrode,
    wherein the thin film encapsulation layer comprises:
    at least one inorganic layer; and
    at least one organic layer that is disposed alternately with the at least one inorganic layer,
    wherein the at least one organic layer comprises:
    a low refractive index layer overlapping the organic light emitting layer; and
    a high refractive index layer disposed on the low refractive index layer, the high refractive index layer having a higher refractive index than a refractive index of the low refractive index layer, and
    wherein the high refractive index layer comprises a convex surface protruding toward the organic light emitting layer and a flat surface opposite to the convex surface.

2. An organic light emitting diode display device comprising:
    a substrate;
    a first electrode disposed on the substrate;
    an organic light emitting layer disposed on the first electrode;
    a second electrode disposed on the organic light emitting layer; and
    a thin film encapsulation layer disposed on the second electrode,
    wherein the thin film encapsulation layer comprises:
    at least one inorganic layer; and
    at least one organic layer that is disposed alternately with the at least one inorganic layer,
    wherein the at least one organic layer comprises:
    a low refractive index layer overlapping the organic light emitting layer; and
    a high refractive index layer disposed on the low refractive index layer, the high refractive index layer having a higher refractive index than a refractive index of the low refractive index layer,
    wherein the high refractive index layer comprises a convex surface protruding toward the organic light emitting layer, and
    wherein the organic light emitting diose display device further comprises a pixel defining layer disposed on the substrate, the pixel defining layer overlapping an edge of the first electrode,
    wherein the pixel defining layer has an aperture defined by a side wall,
    wherein at least a portion of the first electrode is exposed through the pixel defining layer by the aperture, and
    wherein the convex surface of the high refractive index layer is positioned in the aperture.

3. The organic light emitting diode display device of claim 2, wherein the low refractive index layer is disposed in the aperture and comprises a concave surface corresponding to the convex surface of the high refractive index layer.

4. The organic light emitting diode display device of claim 3, wherein at least a portion of the concave surface of the low refractive index layer is thinner than the side wall of the pixel defining layer.

5. The organic light emitting diode display device of claim 2, wherein the at least one inorganic layer covers the organic light emitting layer, the side wall, and the pixel defining layer.

6. The organic light emitting diode display device of claim 5, wherein the inorganic layer has a higher surface tension than the low refractive index layer.

7. The organic light emitting diode display device of claim 1, wherein the low refractive index layer has a refractive index ranging from about 1.4 to about 1.6.

8. The organic light emitting diode display device of claim 1, wherein the high refractive index layer has a refractive index ranging from about 1.61 to about 1.8.

9. The organic light emitting diode display device of claim 1, wherein a difference between a refractive index of the high refractive index layer and a refractive index of the low refractive index layer ranges from about 0.1 to about 0.3.

10. The organic light emitting diode display device of claim 1, wherein the thin film encapsulation layer comprises a light scattering protrusion disposed on a surface of the at least one inorganic layer.

11. The organic light emitting diode display device of claim 10, wherein the light scattering protrusion has substantially a same composition as a composition of the inorganic layer.

12. The organic light emitting diode display device of claim 10, wherein the light scattering protrusion has an average size ranging from about 0.5 µm to about 2.0 µm.

13. The organic light emitting diode display device of claim 10, wherein the light scattering protrusion has a haze ranging from about 30% to about 70%.

14. The organic light emitting diode display device of claim 1, wherein the at least one inorganic layer comprises:
a first inorganic layer disposed between the second electrode and the low refractive index layer; and
a second inorganic layer disposed on the high refractive index layer, and
the thin film encapsulation layer comprises a light scattering protrusion disposed on a surface of the first inorganic layer or the second inorganic layer.

15. The organic light emitting diode display device of claim 14, wherein the light scattering protrusion is disposed on a surface of the first inorganic layer and contacts the low refractive index layer.

16. The organic light emitting diode display device of claim 14, wherein the light scattering protrusion is disposed on a surface of the second inorganic layer and contacts the high refractive index layer.

17. An organic light emitting diode display device comprising:
a substrate;
an organic light emitting diode disposed on the substrate; and
a thin film encapsulation layer disposed on the organic light emitting diode,
wherein the thin film encapsulation layer comprises:
a first inorganic layer disposed on the organic light emitting diode and having a trough shape;
an organic layer disposed on the first inorganic layer filling the trough shape of the first organic layer;
a second inorganic layer disposed on the organic layer; and
a light scattering protrusion disposed on a surface of the first inorganic layer or the second inorganic layer.

18. The organic light emitting diode display device of claim 17, wherein the organic layer comprises:
a low refractive index layer disposed on the first inorganic layer and partially filling the trough shape of the first organic layer; and
a high refractive index layer disposed on the low refractive index layer and partially filling the trough shape of the first organic layer, the high refractive index layer having a higher refractive index than the low refractive index layer, and
wherein high refractive index layer comprises a convex surface protruding toward the organic light emitting diode.

19. The organic light emitting diode display device of claim 17, wherein the light scattering protrusion has an average size ranging front about 0.5 µm to about 2.0 µm.

20. The organic light emitting diode display device of claim 17, wherein the light scattering protrusion is disposed on a surface of the first inorganic layer and contacts the organic layer.

21. The organic light emitting diode display device of claim 20, wherein the light scattering protrusion and the first inorganic layer are formed as a unitary structure.

22. The organic light emitting diode display device of claim 17, wherein the light scattering protrusion is disposed on a surface of the second inorganic layer and contacts the organic layer.

23. The organic light emitting diode display device of claim 22, wherein the light scattering protrusion and the second inorganic layer are formed as a unitary structure.

24. An organic light emitting diode display device, comprising:
a substrate;
a pixel defining layer disposed on the substrate;
an organic light emitting diode (OLED) disposed on the substrate; and
a thin film encapsulation layer disposed on the OLED,
wherein the thin film encapsulation layer comprises:
an organic layer having a first refractive index; and
an organic layer having a second refractive index that is greater than the first refractive index; and
an inorganic layer,
wherein the organic layer having the second refractive index comprises a convex surface protruding toward the OLED, and
wherein a height of at least a portion of the concave surface, measured from the substrate, is less than a maximum height of the pixel defining layer, measured from the substrate.

25. The organic light emitting diode display device of claim 24, wherein the organic layer having the first refractive index is disposed over an organic light emitting layer of the OLED, and the organic layer having the second refractive index is disposed on the organic layer having the first refractive index.

26. The organic light emitting diode display device of claim 24, wherein the organic layer having the first refractive index convex surface protruding toward the OLED.

* * * * *